(12) United States Patent
Sidhu et al.

(10) Patent No.: US 8,149,011 B1
(45) Date of Patent: *Apr. 3, 2012

(54) STRESS PROGRAMMING OF TRANSISTORS

(75) Inventors: Lakhbeer S. Sidhu, Fremont, CA (US);
Choy Hing Li, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 41 days.

This patent is subject to a terminal disclaimer.

(21) Appl. No.: 12/953,117

(22) Filed: Nov. 23, 2010

Related U.S. Application Data

(63) Continuation of application No. 12/053,428, filed on Mar. 21, 2008, now Pat. No. 7,839,160.

(60) Provisional application No. 60/896,143, filed on Mar. 21, 2007.

(51) Int. Cl.
*G01R 31/02* (2006.01)

(52) U.S. Cl. .................. 324/762.09; 324/762.1

(58) Field of Classification Search ............ 324/760.02, 324/762.01, 762.08–762.1
See application file for complete search history.

(56) References Cited

U.S. PATENT DOCUMENTS

| | | | |
|---|---|---|---|
| 5,619,462 A | 4/1997 | McClure | |
| 5,999,011 A | 12/1999 | Chu et al. | |
| 6,020,753 A | 2/2000 | Maeda | |
| 6,133,746 A | 10/2000 | Fang et al. | |
| 6,188,234 B1 * | 2/2001 | Abadeer et al. | 324/762.09 |
| 6,275,059 B1 * | 8/2001 | Sah et al. | 324/762.05 |
| 6,339,339 B2 * | 1/2002 | Maeda | 324/762.09 |
| 6,480,018 B2 | 11/2002 | Ra | |
| 6,541,285 B2 | 4/2003 | Koike | |
| 6,603,328 B2 | 8/2003 | Takahashi et al. | |
| 6,700,151 B2 | 3/2004 | Peng | |
| 6,714,032 B1 | 3/2004 | Reynick | |
| 6,822,471 B2 | 11/2004 | Fleury et al. | |
| 7,404,158 B2 * | 7/2008 | Nakajima | 716/136 |
| 7,619,435 B2 * | 11/2009 | Zhao et al. | 324/762.05 |
| 7,839,160 B1 * | 11/2010 | Sidhu et al. | 324/762.09 |
| 7,882,467 B2 * | 2/2011 | Kuchii | 716/55 |
| 7,990,172 B2 * | 8/2011 | Nakano | 324/762.01 |
| 8,044,676 B2 * | 10/2011 | Hammerschmidt | 324/762.01 |
| 2005/0156589 A1 | 7/2005 | Yamamoto et al. | |
| 2005/0184720 A1 | 8/2005 | Bernstein et al. | |

OTHER PUBLICATIONS

Marchand, "Hot Carrier effects and time-dependent degradation laws in 0.11μm bulk Si n-MOSFETs", Laboratoire de Physique des Composants a Semiconducteurs, Sep. 1997.

* cited by examiner

*Primary Examiner* — Huy Q Phan
*Assistant Examiner* — Joshua Benitez

(57) ABSTRACT

A method comprising applying a first voltage to a first transistor to create a defect in the first transistor, wherein (i) the first voltage is greater than a maximum operational voltage of the first transistor and (ii) the maximum operational voltage does not cause a defect in the first transistor when applied to the first transistor. The method further includes determining whether the first transistor has been programmed, including (i) measuring a first current through the first transistor, (ii) measuring a second current through a second transistor, and (iii) comparing the measured first current to the measured second current, wherein a difference between the measured first current and the measured second current indicates that the first transistor has been programmed.

7 Claims, 5 Drawing Sheets

STRESS PROGRAMMING OF TRANSISTORS

CROSS-REFERENCE TO RELATED APPLICATIONS

This application is a continuation of U.S. application Ser. No. 12/053,428, filed on Mar. 21, 2008, which claims priority to U.S. Provisional Patent Application No. 60/896,143, filed on Mar. 21, 2007. The disclosures of the applications referenced above are incorporated herein by reference.

TECHNICAL FIELD

Embodiments of the present invention relate to the field of electronic devices, and in particular, to programming of transistors.

BACKGROUND

In the current state of integrated circuit technology, transistors such as metal oxide semiconductor (MOS) transistors are typically heavily incorporated into integrated circuits in order to perform a number of functions. These devices typically operate within certain operational parameters in order to prevent damage from occurring to these devices. For example, when performing their normal operations MOS transistors are typically allowed to only operate within a range of operational voltages. If voltages outside of such ranges are applied to these devices, such as when the devices are exposed to a voltage above the maximum allowable operating voltage, these devices will be stressed, causing damage to the devices. The resulting damage will typically degrade the devices reducing their operational capabilities and make such devices less than desirable for their intended use. Thus, circuit designers will typically employ safeguards in order to prevent these devices from being exposed to voltages outside of their normal operating voltages.

SUMMARY

According to various embodiments of the present invention, novel methods are provided that stress transistors in order to program the transistors. A determination can then be made to determine whether such transistors have indeed been programmed by measuring certain operational characteristics, such as dry currents, of the devices. In various embodiments, the novel methods may include initially stressing a first transistor by applying to the first transistor a voltage greater than an operational voltage of the first transistor to create defects in the first transistor, and measuring a first current through the first transistor to determine whether the first transistor has been programmed, the measured first current being indicative of the presence of the defects.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," "some embodiments," or "in various embodiments," which may each refer to one or more of the same or different embodiments. Furthermore, the terms "comprising," "including," "having," and the like, as used with respect to embodiments of the present invention, are synonymous.

The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

According to various embodiments of the present invention, methods are provided in which transistors are purposely stressed, in order to program the transistors. Such methods provide for a novel and secure way of storing data. In some embodiments, in order to program transistors, voltages that are greater than the operational voltages of the transistors may be applied to the transistors, which may cause hot carriers (i.e., energized carriers) to be driven through the transistors. As used herein, the "operational voltages" of a transistor refers to the range of nominal voltages that is provided to a transistor during normal transistor operations that will not cause any or substantially any damage to the transistor. As a result of providing this "stress" voltage, defects may be created in the transistors thus "damaging" or changing the state of the transistors. By causing these defects to form in the transistors, the transistors may be programmed.

In order to subsequently read these programmed transistors, dry currents passing through the transistors may be measured in order to determine whether the transistors have been programmed. The transistors, which for purposes of this description may be referred to as "fuses" or "fuse transistors," may be N or P type metal oxide semiconductor (MOS) transistors. These and other aspects of various embodiments of the present invention will be described in greater detail below.

Figure 1:
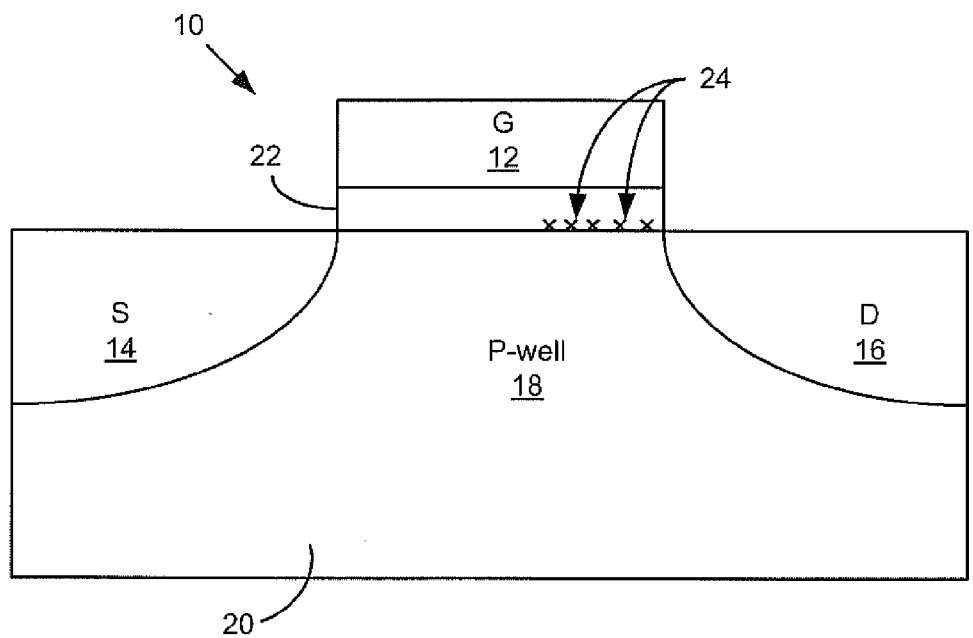
FIG. 1 illustrates a metal oxide semiconductor (MOS) transistor with defects on the drain side of the transistor, in accordance with various embodiments of the present invention.

Although the following description is in reference to NMOS transistors, embodiments of the present invention may be practiced using either PMOS or NMOS transistors. Referring to FIG. 1, which depicts a side view of an NMOS transistor in accordance with various embodiments of the present invention. The NMOS transistor (herein "transistor") 10 includes a gate 12, an oxide layer (or "gate oxide") 22, a source 14, a drain 16, and a P-well 18, all disposed on a substrate 20. By applying a stress voltage that is greater than the operational voltages of the transistor 10 to the drain 16, defects 24 may be formed at the interface of the gate 12 and drain 16. In particular, by applying relatively high voltages to the drain 16, hot carriers such as energized holes and electrons may be driven through the transistor 10. The electric field associated with the hot carriers may cause defects 24 to form at the interface between the gate oxide 22 and the surface of the substrate 20 in the vicinity of the drain side of the transistor 10. These defects may be as the result of the breakage of silicon and hydrogen bonds resulting in electrons and holes being formed at the interface between the gate oxide 22 and the surface of the substrate 20.

In some embodiments, the stress voltage to be applied to the drain 16 may be 20 percent greater than the maximum operational voltage of the transistor 10. In other alternative embodiments, however, the stress voltage to be applied may be less than or greater than 20 percent above the maximum operational voltage.

In various embodiments, in order to accelerate the formation of defects 24 in the transistor 10, a negative voltage may be applied to the substrate 20. For example, in some embodiments, a −1.5 voltage or other negative voltages may be applied to the substrate 20. By negatively biasing the substrate 20, the amount of time needed in order to program the transistor 10 may be reduced. In alternative embodiments, other negative voltages may be applied to the substrate 20 in order to accelerate the formation of the defects 24.

The presence of the defects 24 may impact certain operational performance of the transistor 10 in subsequent nominal operations (e.g., when nominal operational voltages are applied). For example, as the result of the formation of the defects 24, the mobility of the carriers may be reduced and the switch point of the transistor 10 may be altered. Thus, after programming the transistor 10 by stressing the transistor 10 a determination may be made as to whether the transistor 10 has been programmed by simply measuring, for example, the amount of dry current passing through the source 14 and the drain 16 when normal operating voltages are applied to the transistor 10. This may include grounding the substrate 20 as well as applying nominal operational voltages to the source 14 or the drain 16. The amount of dry current passing through the transistor 10 may be indicative of the presence of the defects 24. That is, the presence of the defects 24 may reduce the amount of dry current passing through the transistors (i.e., between the source 14 and drain 16) for any given operational voltage.

In some embodiments, the measured dry current between the source 14 and the drain 16 of the programmed transistor 10 may be compared to the measured dry current of an unstressed reference transistor in order to determine whether the transistor 10 has been programmed. The measurements of the dry currents of the programmed transistor 10 and the reference transistor may be made when both the programmed transistor 10 and the reference transistor are in linear states.

The processes described herein for stressing transistors are novel alternative approaches for storing data on chips in a non-volatile manner. In particular, by purposely creating defects in transistors, codes and logic may be more securely stored on chips rather than through conventional techniques.

For example, in some conventional integrated circuit chips, codes may be stored in fuses comprising of silicide components. In order to program these silicide fuses, a voltage is applied to these fuses that results in a highly energized current being driven through the fuses. As a result, the physical characteristic of these silicide components are altered, which can actually be visually detected. Thus, data stored using such conventional fuses may be relatively easily compromised. In contrast, the stress methods used to program the fuse transistors described herein may not be visually detected making these stressed transistors a more secure technique for storing data.

Figure 2:
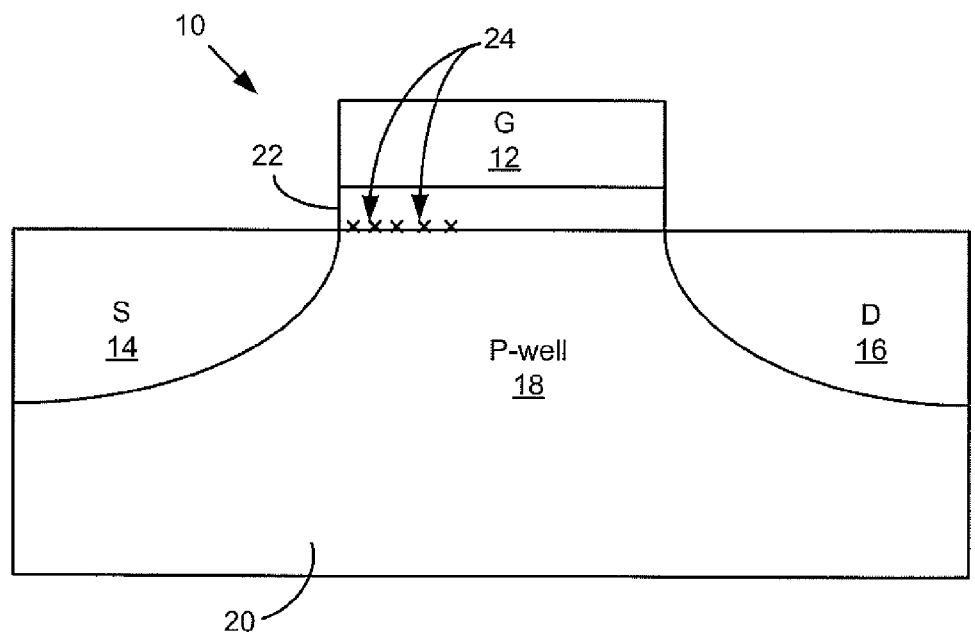
FIG. 2 illustrates the MOS transistor of FIG. 1 with defects on the source side of the transistor, in accordance with various embodiments of the present invention.

In some alternative embodiments or the same embodiments, the transistor 10 depicted in FIG. 1 may also be stressed by applying a stress voltage to the source 14 rather than or in addition to applying the stress voltage to the drain 16 as previously described. This is depicted in FIG. 2, where defects 24 have formed at the interface between the gate oxide 22 and the surface of the substrate 20 in the vicinity of the source side of the transistor 10 rather than in the vicinity of the drain 16. As before, this may be accomplished by applying a stress voltage that is greater (e.g., 20 percent or more) than the maximum operational voltage of the transistor 10. A negative biasing voltage may also be applied to the substrate 20 in order to accelerate the formation of the defects 24.

Figure 3:
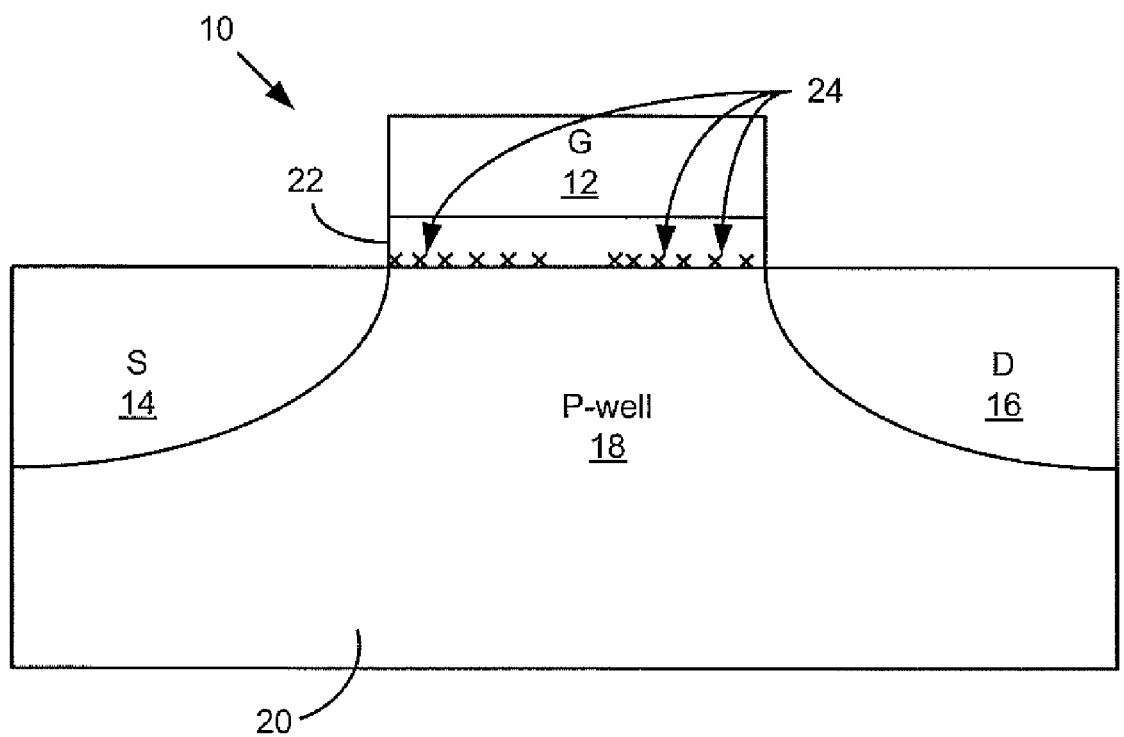
FIG. 3 illustrates the MOS transistor of FIG. 1 with defects on both the drain and source sides of the transistor, in accordance with various embodiments of the present invention.

FIG. 3 depicts the transistor 10 when a stress voltage greater than a maximum operational voltage of the transistor 10 is initially applied to a first one of the source 14 and drain 16 followed by applying the stress voltage to the second one of the source 14 and drain 16. Consequently, a greater number of defects 24 may form at the interface between the gate oxide 22 and the surface of the substrate 20 then may be obtained by simply applying a stress voltage to only one of the source 14 or the drain 16. Further, the defects 24 that are formed by applying the stress voltage to both the source 14 and the drain 16 may be more evenly distributed along the interface between the gate oxide 22 and the surface of the substrate 20, thus having a greater influence on the carriers. This may result in greater reduction in carrier mobility and in effect, better programming of the transistor 10. As before, in order to reduce the time it takes to create the defects 24, a negative bias voltage may be applied to the substrate 20.

When the transistor 10 is to be read (i.e., to determine whether the transistor 10 has been programmed), the substrate 10 may be grounded, and an operational voltage that is less than the stress voltage may be applied to either the source 14 or the drain 16, in order to generate a dry current between the source 14 and drain 16. The application of the operational voltage in order to generate the dry current may be performed, in some embodiments, when the transistor 10 is in a linear state. The dry current flowing between the source 14 and the drain 16 may then be measured, and compared to a dry current between a source and drain of a reference transistor (not depicted) that has not been previously stressed. In dong so, a determination can be made as to whether the transistor 10 has been programmed. For example, if the dry current of the transistor 10 is determined to be less than the dry current of the reference transistor, this may indicate that the transistor 10 has indeed been programmed.

In some embodiments, in order to obtain more reliable results, the combined dry currents for a set or collection of fuse transistors (e.g., transistor 10) may be compared to the combined dry currents of a collection of reference transistors. That is, since the characteristics of any particular reference transistor may vary as a result of, for example, variations in the fabrication processes of the reference transistor, the results of a comparison between a dry current from a single fuse transistor and a dry current from a single reference transistor may be unreliable.

Thus, in some embodiments, the combined dry currents for a collection of two or more fuse transistors may be compared to the combined dry currents for a collection of two or more corresponding reference transistors in order to determine whether the collection of two or more fuse transistors have been programmed. For these embodiments, this may entail measuring the total dry currents of the collection of the two or more fuse transistors, and comparing that total measurement to the total dry currents of the collection of two or more corresponding reference transistors in order to determine whether the group of two or more fuse transistors has been programmed.

Figure 4:
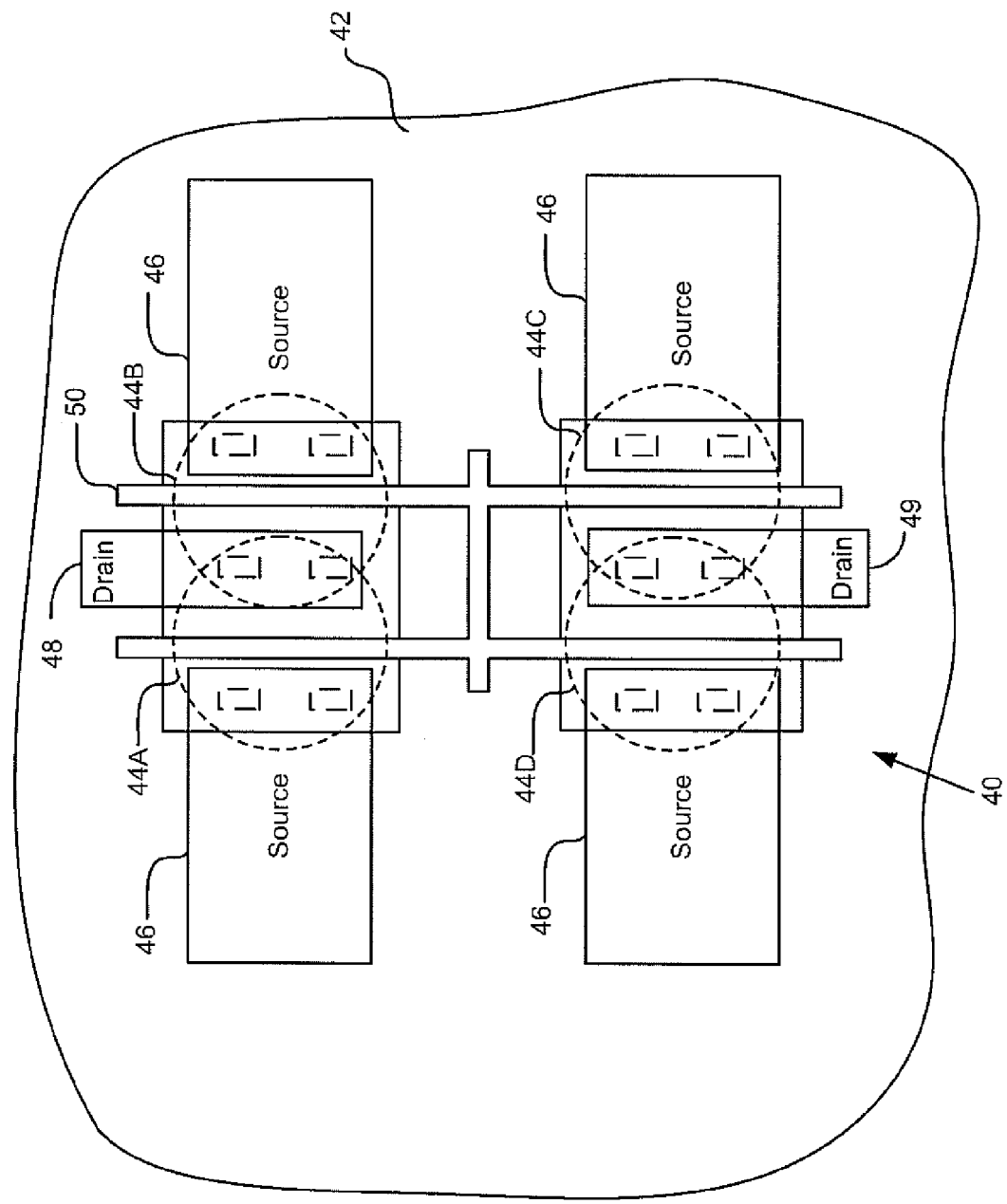
FIG. 4 illustrates a plan view of a collection of fuse transistors, in accordance with various embodiments of the present invention.

FIG. 4 depicts a plan view of a collection of fuse transistors in accordance with various embodiments of the present invention. The collection of fuse transistors (herein "fuse collection") 40 includes four fuse transistors 44A, 44B, 44C, and 44D, as generally represented by the dotted circles, the four fuse transistors 44A, 44B, 44C, and 44D being disposed in a portion of a substrate (herein "substrate") 42. Each of the fuse transistors 44A, 44B, 44C, and 44D include a source 46, a drain 48 or 49, and a common gate 50 that is shared by the four fuse transistors 44A, 44B, 44C, and 44D. Note that the top two fuse transistors 44A and 44B share a common drain 48, while the bottom two fuse transistors 44C and 44D share another common drain 49. Although not depicted, in some embodiments, the two drains 48 and 49 may be electrically coupled together. Similarly, and although not depicted, in some embodiments, the sources 46 for the four fuse transistors 44A, 44B, 44C, and 44D may be electrically coupled together.

In order to program the fuse collection 40, a stress voltage that is greater than the operational voltages of the fuse transistors 44A, 44B, 44C, and 44D may be applied to the drains 48 or 49 and/or the sources 46 of the fuse transistors 44A, 44B, 44C, and 44D. In some embodiments, the stress voltage or voltages to be applied may be 20 percent or more above the maximum operational voltages of the fuse transistors 44A, 44B, 44C, and 44D. In alternative embodiments, a stress voltage or voltages that is or are less than 20 percent above the maximum operational voltages of the fuse transistors 44A, 44B, 44C, and 44D may be applied to the fuse transistors 44A, 44B, 44C, and 44D. A negative voltage may be concurrently provided to the substrate 42 as the stress voltage or voltages is or are being applied to the fuse transistors 44A, 44B, 44C, and 44D to accelerated the programming of the fuse transistors 44A, 44B, 44C, and 44D.

In order to read the fuse collection 40 to determine whether the fuse collection 40 has been programmed, the substrate 42 may be grounded and an operational voltage that is within the operational voltage range of the fuse transistors 44A, 44B, 44C, and 44D may be applied to the fuse transistors 44A, 44B, 44C, and 44D, either to the sources 46 or the drains 48 and 49. As a result of the application of the operational voltage, dry currents may be driven through the fuse transistors 44A, 44B, 44C, and 44D, which may then be measured at either the sources 46 or the drains 48 and 49. In some embodiments, the four fuse transistors 44A, 44B, 44C, and 44D may be operating in linear states when the dry currents of the four fuse transistors 44A, 44B, 44C, and 44D are generated and measured.

The measurements of the dry currents may then be combined and compared to the combined measurements of dry currents of a corresponding collection of reference transistors in order to determine whether the fuse collection 40 has been programmed. Alternatively, if the sources 46 of the fuse transistors 44A, 44B, 44C, and 44D are coupled together, then only a single measurement may be needed at the point where the sources 46 are coupled together in order to determine the combined dry currents of the fuse transistors 44A, 44B, 44C, and 44D. Similarly, if the drains 48 and 49 are coupled together, then only a single measurement may be needed at the point where the drains 48 and 49 are coupled together in order to determine the combined dry currents of the fuse transistors 44A, 44B, 44C, and 44D.

Although the collection 40 depicted in FIG. 4 has a particular structure that includes four fuse transistors 44A, 44B, 44C, and 44D, other numbers of fuse transistors may be employed in alternative embodiments. For example, in some alternative embodiments, a collection of two, three, or more than four fuse transistors may be used. For these embodiments, the fuse transistors in a fuse collection may be coupled together serially and/or in parallel.

Figure 5:
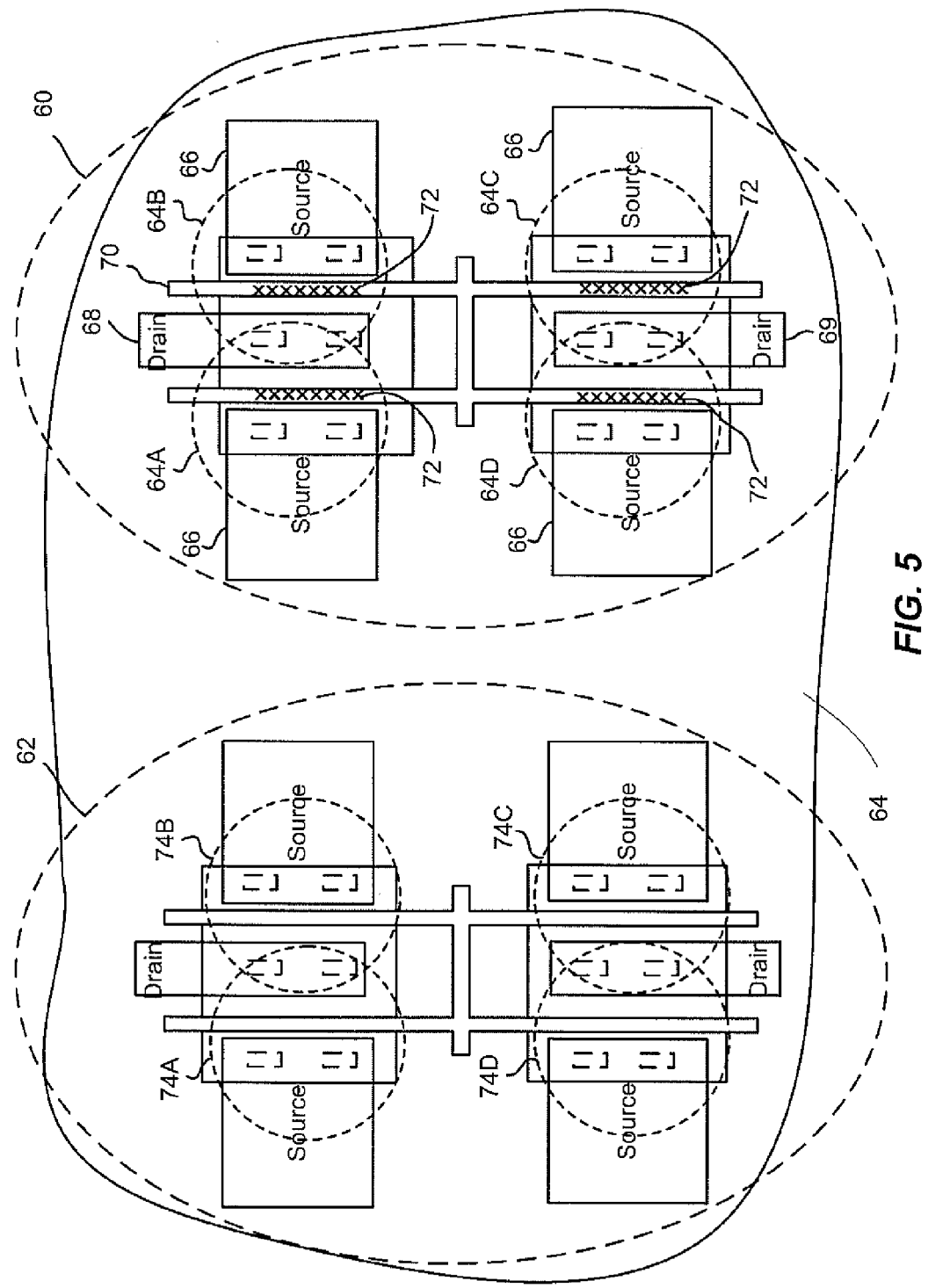
FIG. 5 illustrates a plan view of a collection of programmed fuse transistors and a collection of reference transistors, in accordance with various embodiments of the present invention.

FIG. 5 depicts a collection of fuse transistors (herein "fuse collection") 60 that has been programmed and a collection of reference transistors (herein "reference collection") 62 in accordance with various embodiments. In particular, the fuse collection 60 includes four fuse transistors 64A, 64B, 64C, and 64D, that have been previously stressed and programmed, and the reference collection 62 includes four corresponding reference transistors 74A, 74B, 74C, and 74D, that have not been previously stressed. Both the fuse collection 60 and the reference collection 62 are disposed on a portion of a substrate (herein "substrate") 64. Each of the fuse transistors 64A, 64B, 64C, and 64D having a source 66, a drain 68 or 69, a common gate 70 that is shared by the fuse transistors 64A, 64B, 64C, and 64D, and defects 72.

The reference collection 62 includes four reference transistors 74A, 74B, 74C, and 74D corresponding to the four fuse transistors 64A, 64B, 64C, and 64D. In order to read the fuse collection 60 to determine whether the fuse collection 60 has been programmed, the combined dry currents of the four fuse transistors 64A, 64B, 64C, and 64D flowing between the respective drains and sources of the four fuse transistors 64A, 64B, 64C, and 64D may be compared to the combined dry currents flowing through the respective sources and drains of the corresponding reference transistors 74A, 74B, 74C, and 74D. In some embodiments, a determination may be made that the fuse collection 60 is indeed programmed if the combined dry currents of the four fuse transistors 64A, 64B, 64C, and 64D is less than the combined dry currents of the reference transistors 74A, 74B, 74C, and 74D.

Figure 6:
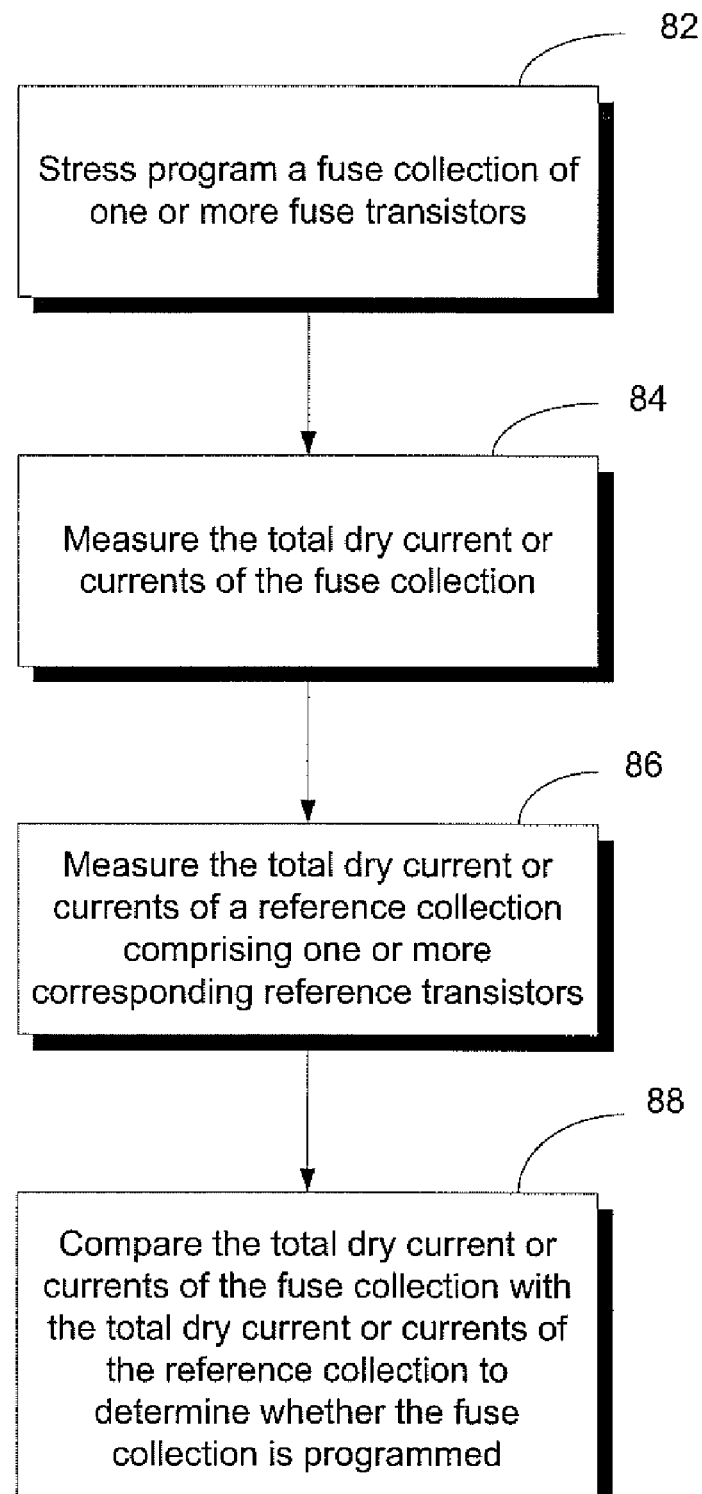
FIG. 6 is a flow chart of a process for programming a fuse collection of one or more fuse transistors, and for subsequently reading the fuse collection, in accordance with various embodiments of the present invention.

FIG. 6 depicts a flow chart of a process for programming a fuse collection of one or more fuse transistors, and for subsequently reading the fuse collection in order to determine whether the fuse collection has been programmed in accordance with various embodiments of the present invention. The process 80 generally represents the processes previously described. The process 80 may begin when a fuse collection of one or more fuse transistors are stressed programmed at 82. This may be accomplished by stressing the one or more fuse transistors with the application of a stress voltage or voltages to the one or more fuse transistors that is or are greater than the operational voltages of the one or more fuse transistors.

The application of the stress voltage or voltages may be at the drain or drains and/or source or sources of the one or more fuse transistors. In some embodiments, the substrate underlying the one or more fuse transistors may be provided with a negative voltage in order to accelerate the programming process.

The one or more fuse transistors may then be provided with operational voltage or voltages to generate dry current or currents through the one or more fuse transistors. Additionally, the underlying substrate may be grounded. The total or combined dry current or currents of the fuse collection may then be measured at 84. A measurement of the total or combined dry current or currents flowing through a reference collection comprising of one or more reference transistors that corresponds to the one or more fuse transistors may be made at 86. A comparison may then be made between the total dry current or currents of the fuse collection with the total dry current or currents of the reference collection to determine whether the fuse collection is programmed at 88.

Although specific embodiments have been illustrated and described herein, it will be appreciated by those of ordinary skill in the art and others, that a wide variety of alternate and/or equivalent implementations may be substituted for the specific embodiments illustrated and described without departing from the scope of the present invention. This application is intended to cover any adaptations or variations of the embodiments discussed herein. Therefore, it is manifested and intended that various embodiments of the invention be limited only by the claims and the equivalents thereof.

What is claimed is:

1. A method, comprising:
    applying a first voltage to a first transistor to create a defect in the first transistor, the first voltage being greater than a maximum operational voltage of the first transistor, wherein the maximum operational voltage does not cause a defect in the first transistor when applied to the first transistor; and
    determining whether the first transistor has been programmed, including
        measuring a first current through the first transistor,
        measuring a second current through a second transistor, and
        comparing the measured first current to the measured second current,
    wherein a difference between the measured first current and the measured second current indicates that the first transistor has been programmed.

2. The method of claim 1, wherein measuring a second current through a second transistor comprises measuring a second current through a reference transistor that does not contain a defect.

3. The method of claim 1, wherein the first voltage is at least 20 percent higher than the maximum operational voltage of the first transistor.

4. The method of claim 1, wherein applying the first voltage to the first transistor comprises applying the first voltage to both (i) a drain of the first transistor and (ii) a source of the first transistor.

5. The method of claim 1, wherein measuring a first current through the first transistor comprises measuring a first current through a metal oxide semiconductor transistor.

6. The method of claim 1, wherein applying a first voltage to a first transistor to create a defect in the first transistor comprises creating the defect at an interface between (i) a gate oxide of the first transistor and (ii) a surface of a substrate of the first transistor.

7. The method of claim 6, wherein applying a first voltage to a first transistor to create a defect in the first transistor comprises creating the defect by hot carriers being driven through the first transistor.

* * * * *